(12) United States Patent
Campbell, Jr. et al.

(10) Patent No.: US 6,297,757 B1
(45) Date of Patent: Oct. 2, 2001

(54) METHOD AND CIRCUIT FOR TESTING AN ANALOG-TO-DIGITAL CONVERTER MODULE ON A DATA PROCESSING SYSTEM HAVING AN INTERMODULE BUS

(75) Inventors: Jules D. Campbell, Jr.; Jiang Chen; Robert S. Jones, III; Christian Ahrens, all of Austin; Scott Willard Herrin, Round Rock, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/248,551

(22) Filed: Feb. 11, 1999

(51) Int. Cl.[7] .............................. H03M 1/06; H03M 1/10
(52) U.S. Cl. ................................ 341/120; 341/118
(58) Field of Search ...................... 341/120, 118, 341/141, 155; 714/26, 30, 724, 731

(56) References Cited

U.S. PATENT DOCUMENTS

| 5,081,454 | 1/1992 | Campbell, Jr. et al. ............ 341/141 |
| 5,157,781 | * 10/1992 | Harwood et al. ...................... 714/30 |
| 5,175,547 | 12/1992 | Lyon et al. ............................ 351/120 |
| 5,185,607 | 2/1993 | Lyon et al. ............................ 341/120 |
| 5,485,466 | * 1/1996 | Lyon et al. ............................ 714/731 |
| 5,544,308 | * 8/1996 | Giordano et al. ....................... 714/26 |
| 5,724,035 | * 3/1998 | Sakuma ................................. 341/120 |
| 6,076,177 | * 6/2000 | Fontenot et al. ...................... 714/724 |

OTHER PUBLICATIONS

Jose A Lyon et al., Motorola, Inc., "Testability Features of the 68HC16Z1", International Test Conference 1991, Paper 5.1, 1991 IEEE, pp. 122–130.

Clyde Browning, Motorola, Inc., "Testing A/D Converters On Microcomputers", 1985 International Test Conference, Paper 22.3, 1985 IEEE, pp. 818–824.

E. Peralias et al., "A DFT Technique for Analog–to–digital Converters With Digital Correction", 199715th IEEE VLSI Test Symposium, (Cat. #TB100125—p. 302–7), 1 pg.

\* cited by examiner

*Primary Examiner*—Patrick Wamsley

(57) ABSTRACT

A data processing system (20) includes a plurality of modules (44, 48) and an analog-to-digital converter (ADC) (46). The ADC (46) includes at least one port terminal (66) for transmitting test information from the ADC (46). The plurality of modules (44,48) and the ADC (46) are coupled to a central processing unit (CPU) (22) via an intermodule bus (42). A tester can exchange test information with the ADC (46) directly through the port terminal (66) instead of using the intermodule bus (42). Also, various sub-modules (62, 64, 60, 74) of the ADC (46) can be independently tested without performing a conversion process.

10 Claims, 5 Drawing Sheets

METHOD AND CIRCUIT FOR TESTING AN ANALOG-TO-DIGITAL CONVERTER MODULE ON A DATA PROCESSING SYSTEM HAVING AN INTERMODULE BUS

FIELD OF THE INVENTION

The present invention generally relates to analog-to-digital converters (ADCs), and more particularly, to a circuit for, and method of, testing an ADC.

BACKGROUND OF THE INVENTION

ADCs are used in a variety of applications for converting analog signals to their equivalent digital signals as stand alone ADCs or as an embedded ADC module on board data processing systems, such as a microprocessor or a microcontroller. To ensure that the ADC is reliable, the ADC is tested using a variety of tests over a full range of input and output values by performing numerous test conversions, i.e. analog to digital conversions, on the ADC. In an ADC integrated on a microcontroller, this testing is typically performed by first sending testing control information to the ADC through an on-chip internal bus, where the internal bus is used to interconnect the various modules of the microcontroller with each other and to a central processing unit (CPU). The testing control information is used to place the ADC in a particular test mode. Next, thousands of test conversions are performed on the ADC. Then, the test results of the test conversions are returned through the internal bus to determine if the ADC is functioning properly.

Several problems exist with this testing protocol. First, because the internal bus is needed for retrieving the test results, using the internal bus for concurrent testing of other modules located on a microcontroller, for example, is not possible during the testing of the ADC. This "heavy usage" of the internal bus slows down the testing of modules on the microcontroller and thereby increases costs. This is particularly true since this type of testing subjects the ADC to thousands of test conversions when all of the different operating modes, conversion parameters and result memory locations must be tested. Secondly, the use of the internal bus for receiving results of special tests of the ADC affects the test quality.

Two factors that affect the test quality of the ADC testing are the controllability of each test conversation and the observability of the resulting test during the test conversion to locate ADC testing problems, particularly in embedded ADCs where the test conversion is not easily monitored. The use of the internal bus deteriorates the test quality because each of the special ADC tests is not easily observed and controlled when using the internal bus in this manner and thereby limits debugging capabilities, fault grading and characterization of circuits being tested. Thus, the test quality of the ADC would improve if alternative paths, other than the internal bus, were used to improve control and observability of each test.

A need therefore exists to improve the testing of ADCs by reducing the time and costs needed to test the ADC, as well as to improve the quality of those tests.

BRIEF DESCRIPTION OF THE DRAWINGS

A better understanding of the present invention can be obtained when the following detailed description of a preferred embodiment is considered in conjunction with the following drawings, in which.

Figure 1:
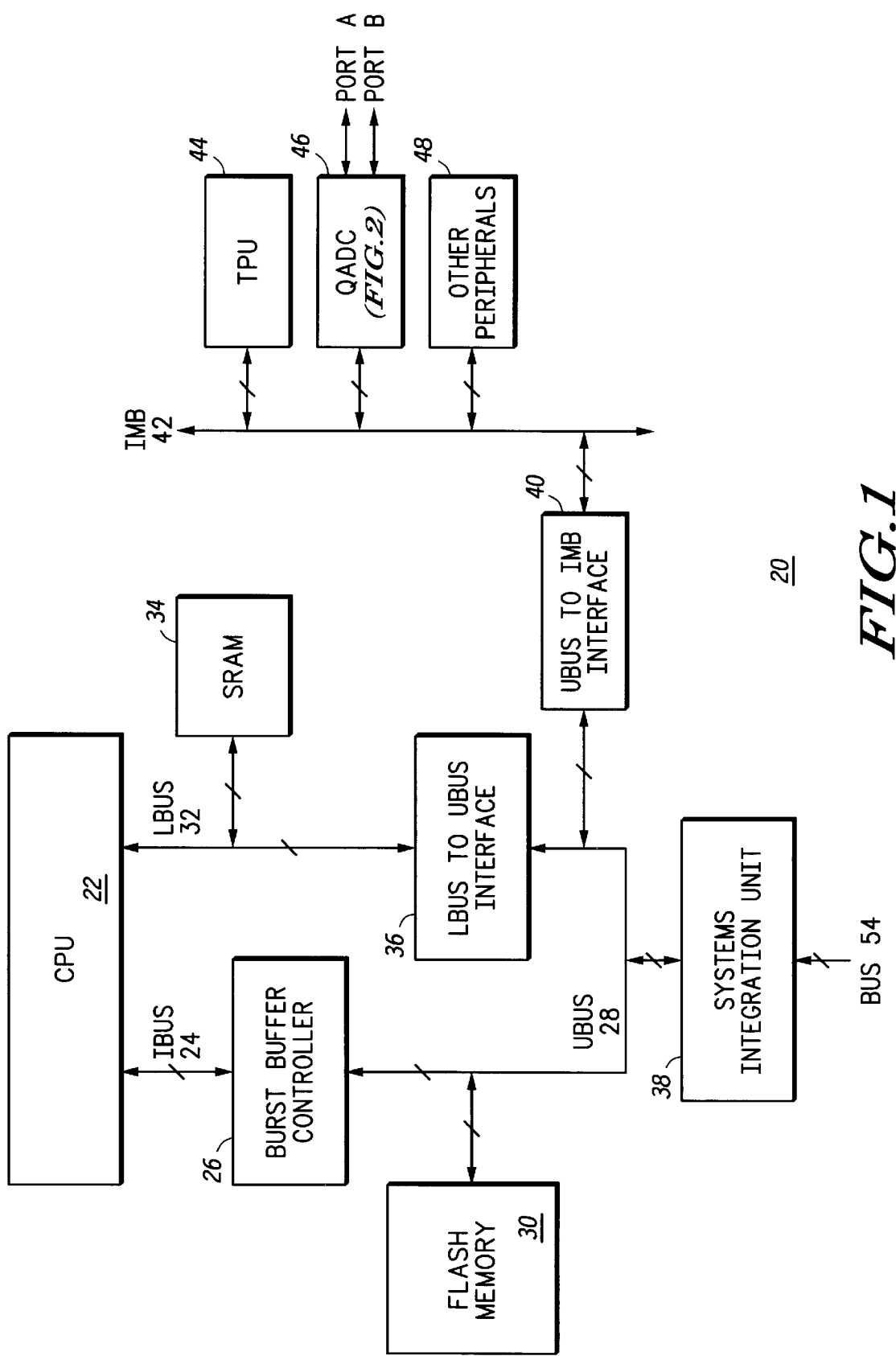
FIG. 1 illustrates, in block diagram form, a queued analog-to-digital (A/D) converter (QADC), embedded in a data processing system, to be tested using the test circuits and method of testing in accordance with the present invention.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements. Additionally, where a plurality of connections are intended between modules, a conventional slash across a single line is optionally provided with the number of the plurality of connections provided therewith.

DETAILED DESCRIPTION OF A PREFERRED EMBODIMENT

While several embodiments of the present invention will be described in detail below, the present invention common to all embodiments lies in an data processing system having an analog-to-digital conversion system for processing data and for exchanging test information with an external tester. The data processing system has at least one port pin for transmitting test information from the ADC. The data processing system also has a plurality of modules for processing the data and an intermodule bus (IMB) for connecting the ADC to the plurality of modules and to the CPU. The external tester exchanges test information with the ADC directly through the port pin only and not through the IMB. Methods for testing a plurality of the modules located on the ADC are also provided herein. The methods of the present invention are methods of testing particular modules and submodules of an ADC, particularly methods of testing a queued ADC (QADC), a buffer, a bias circuit, a comparator circuit, a capacitor digital-to-analog converter (CDAC), a resistor digital-to-analog converter (RDAC), the ADC itself, a queue control logic and a multiplexer. The embodiments of the present invention will now be described in detail with reference to FIGS. 1–6.

FIG. 1 illustrates, in block diagram form, a queued analog-to-digital converter (QADC) embedded in a data processing system, such as a microcontroller, to be tested using the test circuits and the method of testing particular circuits in accordance with the present invention. In FIG. 1, data processing system 20 has the test circuits of the present invention located in QADC 46. QADC module 46 is bi-directionally coupled to IMB 42 by a plurality of I/O pins. IMB 42 is used to "set up" the QADC 46 by sending initial test information to the QADC 46. The initial test information is used to place QADC into a particular test mode and includes writing a test number to registers located in the QADC 46. By "queued", it is understood that the A/D converter operates in response to one or more queues of Conversion Command Words (CCW) as described in more detail below. Eight of the I/O pins [0:7] of the QADC 46 function as PORT A while another eight function as PORT B. In test mode, these ports serve as direct testing pins of the QADC 46. Under normal operating modes, these pins serve as a plurality of analog inputs, and may also provide digital input/output functions. It is understood that while this embodiment denotes eight pins, more or less pins may be used to achieve the result of the present invention as claimed below. Such result achieves the transmittal of test information of the QADC 46 to an external tester, such as a Teradyne J971, directly through the at least one port pin, without using the IMB to achieve the benefits described below. The tester along with data processing system 20 complete an analog to digital conversion test system.

In the illustrated embodiment, only the initial test set up information is transmitted to QADC 46 via the IMB 42. After the test information is sent via IMB 42 to set up the testing of QADC 46, the test control inputs and the test results of the QADC are sent through PORT A and PORT B which are bi-directionally coupled to QADC 46 to transfer information to a user to avoid using IMB 42 for test control and to report test results. The results of the test of provided back to the tester via either PORT A or PORT B as described in more detail below.

By using PORT A and PORT B rather than IMB 42 for this purpose, other modules (FIG. 3) on QADC 46 may be accessed and concurrently tested, separately and independently, to decrease testing time. Furthermore, PORT A and PORT B provide another advantage of increasing control and observability of a test being performed on QADC 46 as also described below. Thus, production test time can be reduced by using simple test modes on various circuit blocks and by using a first fail mode strategy that can be quickly observed before additional and costly tests are performed. Also, the performance of the individual circuit blocks in QADC 46 can be directly observed from measurements, rather than by inference. As such, there is a tremendous benefit of testing QADC 46 using its own I/O pins, i.e. through PORT A and PORT B, rather than IMB 42.

Still referring to FIG. 1, data processing system 20 has a plurality of modules which are connected are IMB 42, and include, for example, time processing unit (TPU) 44 and other peripherals 48. The plurality of modules also includes a central processing unit (CPU) 22 that is bi-directionally coupled through an instruction bus (IBUS) 24 to burst buffer controller 26 and through load bus (LBUS) 32 to an LBUS to unified bus (UBUS) interface 36. Other modules include flash memory 30, which is bi-directionally coupled to UBUS 28, and static random access memory (SRAM) 34 which is bi-directionally coupled to LBUS 32. Burst buffer controller 26, another module, is bi-directionally coupled to LBUS to UBUS Interface 36 via UBUS 28, while UBUS 28 is bi-directionally coupled to UBUS to IMB interface 40. Systems integration unit 38 is bi-directionally coupled to the UBUS 28 and has inputs from bus 54.

In operation, CPU 22 executes instructions which are fetched from flash memory 30 using burst buffer 26, or fetched from external memory on bus 54 using SIU 38. Bi-directional access to the modules on IMB 42, for example, TPU 44, QADC 46, and other peripherals 48, is performed through UBUS to IMB interface 40. Operating modes and instructions are programmed by CPU 22 into various registers in the modules (not shown) while data is read back from other registers in the modules. The modules may also interface to the system external to data processing system 20 via ports not illustrated in FIG. 1.

Figure 2:
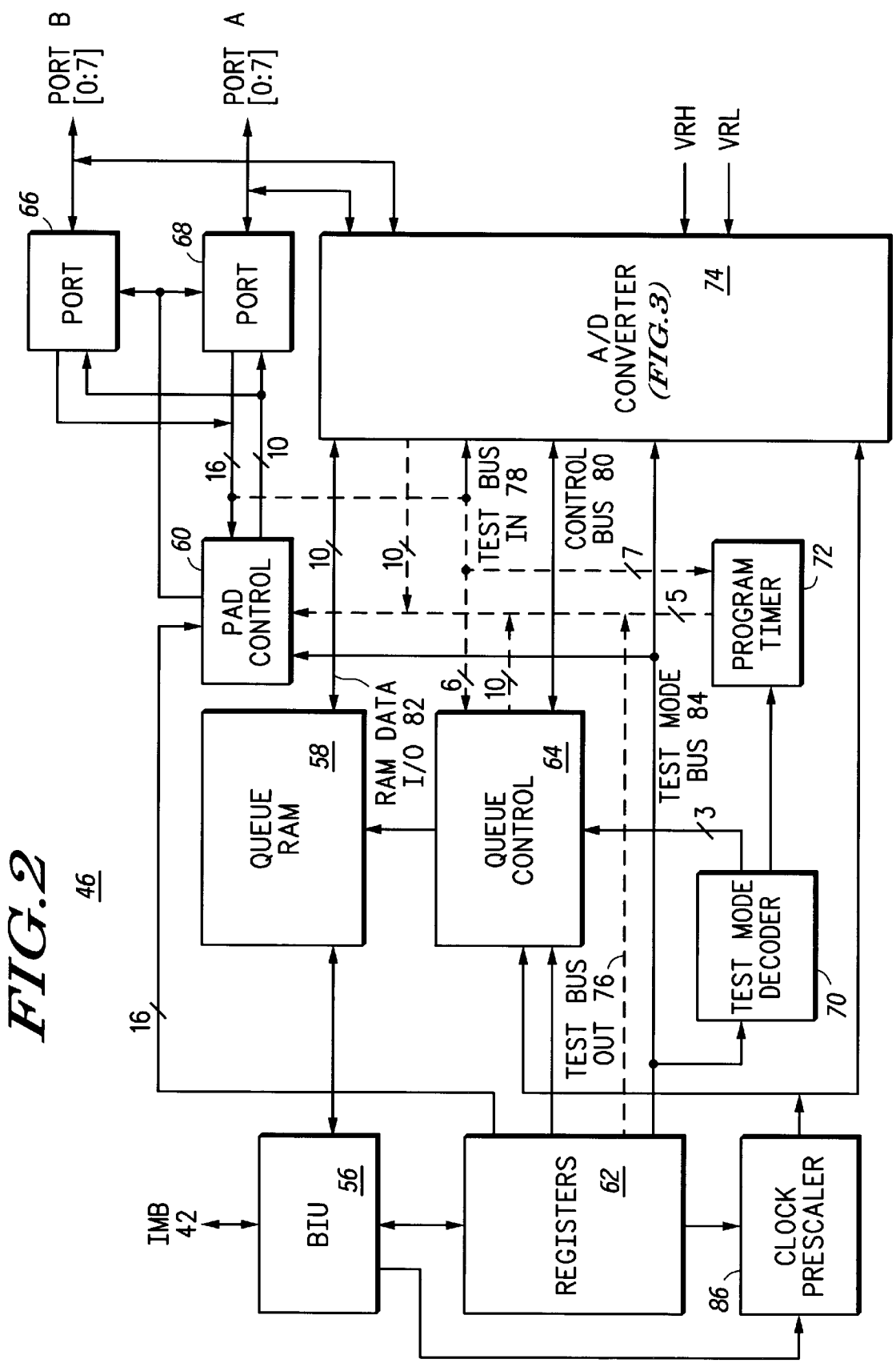
FIG. 2 illustrates, in block diagram form, the QADC of FIG. 1.

FIG. 2 illustrates, in block diagram form, QADC 46 of FIG. 1 in more detail. QADC 46 has a plurality of modules including bus interface unit (BIU) 56, queued random access memory (RAM) 58, pad control 60, registers 62, queue control 64, port 66, port 68, test decoder 70, program timer 72, clock prescaler 86 and A/D converter 74. BIU 56 is bi-directionally coupled to IMB 42 to receive data and instructions via IMB 42 and to provide control information to queue control 64 through registers 62. Also, BIU 56 is bi-directionally coupled to register 62 and BIU 56 bi-directionally exchanges data with queue RAM 58.

Queue RAM 58 is a conventional static random access memory and can be accessed via either BIU 56 or A/D converter 74. Queue control 64 controls the operation of queue RAM 58 based on control information received from registers 62 and controls the operation of A/D converter 74 via control bus 80. Registers 62 further provide data to A/D converter 74 and to test decoder 70 which, in turn, provides information to program timer 72 and queue control 64. Registers 62 also provide data to the A/D converter 74 via the test mode bus 84. A high reference voltage labeled "VRH" and a low reference voltage labeled "VRL" are provided into the A/D converter 74. Pad control 60 is bi-directionally coupled to both port 66 and port 68, which, in turn, are bi-directionally coupled to PORT A and PORT B, respectively. Based on control information received from register 62, pad control 60 controls the transfer of information to and from ports 66 and 68, which can also function as test buses. In the illustrated embodiment, port 66 is used for inputting and outputting information from QADC 46, or at least from one of a plurality of modules on the QADC 46, to an external test system. Likewise port 68 bi-directionally couples information from QADC 46 to or from the external test system. Each port couples to eight terminals or pads, although the number of terminals or pads are not important for purposes of illustrating the invention and may be different in other embodiments. Again, as detailed above, the use of port 66 and port 68 to transmit test information outside of the QADC 46 directly through PORT B and PORT A to the plurality of modules, respectively, provides decreased testing time and improved controlability and observability of QADC 46.

Also in FIG. 2, a clock prescaler 86 receives clock signals from IMB 42 via BIU 56 and, based on control signals received from registers 62, provides a divided clock signal to queue control 64 and to A/D converter 74. A test bus labeled TEST BUS OUT 76 (dashed lines) is coupled to receive test information from registers 62, queue control 64, program timer 72 and A/D converter 74 and provide the test information to either PORT A or PORT B via pad control 60. Likewise, a test bus labeled TEST BUS IN 78 (dashed lines) receives test information from PORT A and/or PORT B and provides test information to A/D converter 74, queue control 64, and program timer 72.

The presence of TEST BUS IN 78 and TEST BUS OUT 76 in QADC 46 provides significant benefits. By coupling the test buses 76 and 78 to various modules on the QADC 46, these modules can be tested separately and independently through PORT A and PORT B. In essence, the test buses 76 and 78 provide the direct testing benefits described above with regard to PORT A and PORT B that avoid the use of the IMB 42. By sending the test results directly to a tester through PORT A and PORT B, the controlability and observability of the test is increased. Thus, a tester is able to use TEST BUS IN 76 and TEST BUS OUT 78 to functionally test QADC 46 during the manufacturing process of data processing system 20. Further, the test features, as described in detail below, have been designed into QADC 46 in order to improve controllability of testing as well as to provide better observability of results as compared to known testing procedures.

QADC 46, in the illustrated embodiment, is a ten-bit successive approximation converter. It should be apparent to one of ordinary skill in the art that the successive approximation converter could comprise more or less than ten bits and it should also be apparent that the analog-to-digital converter may be a resistive type or a capacitive type. During normal operation of the QADC 46, a conversion command word (CCW) is received via IMB 42 and stored in a first portion (not shown) of queue RAM 58. The CCW allows QADC 46 to automatically take multiple samples of one channel in rapid succession or to sample once from all or some of the analog input terminals. Following a conversion, the results of the conversion are put in a second portion (not shown) of queue RAM 58.

Figure 3:
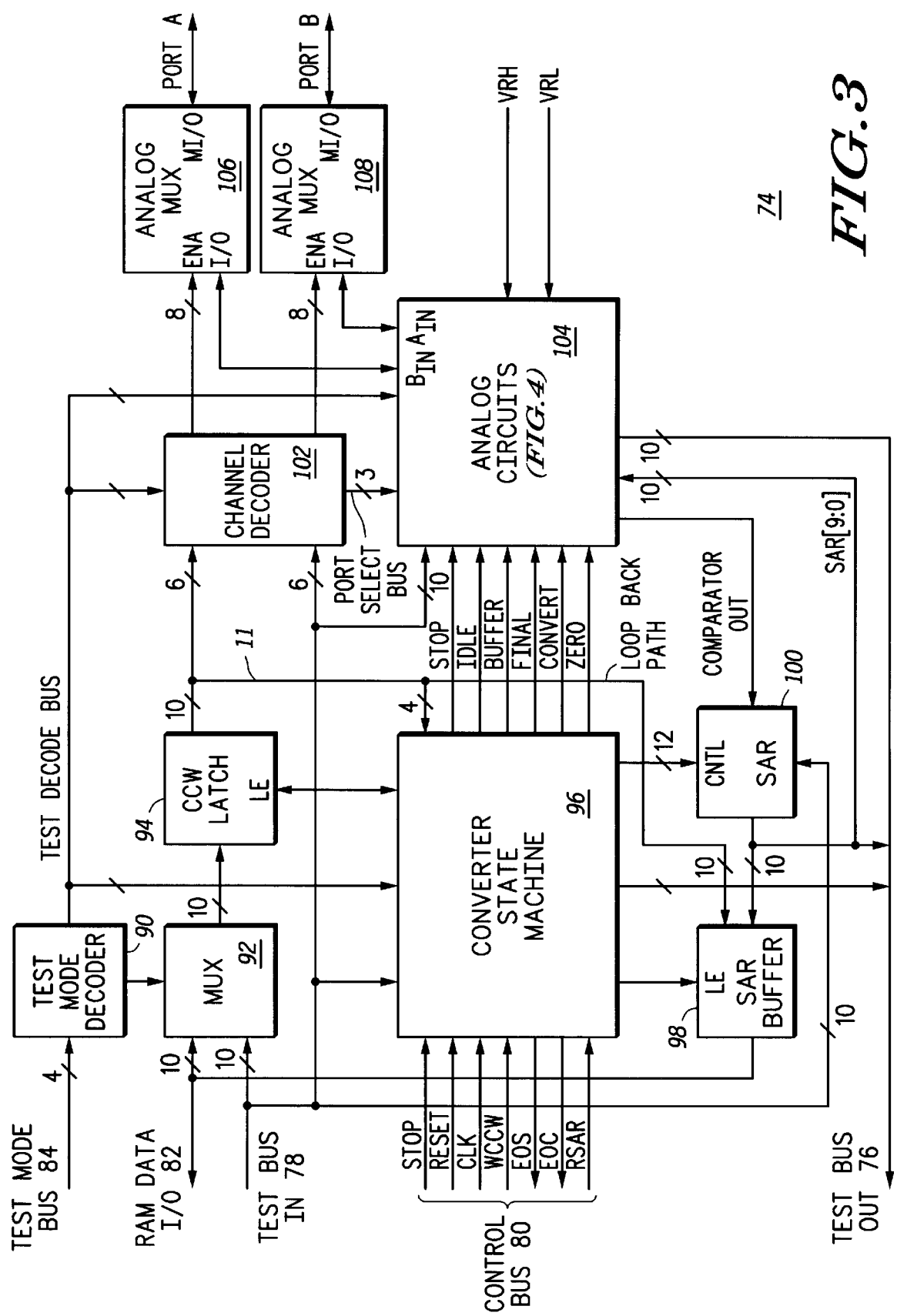
FIG. 3 illustrates, in block diagram form, the A/D converter of FIG. 2.

FIG. 3 illustrates, in block diagram form, A/D converter 74 of FIG. 2. A/D converter 74 is organized into a plurality of sub-modules and includes test mode decoder 90, multiplexer 92, CCW latch 94, converter state machine 96, successive approximation register (SAR) buffer 98, SAR 100, channel decoder 102, analog circuits 104, analog multiplexer 106 and analog multiplexer 108. Test mode decoder 90 includes a plurality of input terminals coupled to test mode bus 84, and a plurality of output terminals labeled "TEST DECODE BUS" coupling the decoder 90 to analog circuits 104. Multiplexer 92 includes a plurality of terminals coupled to RAM data I/O bus 82, a plurality of input terminals coupled to TEST BUS IN 78, and a plurality of output terminals coupled to CCW latch 94. TEST BUS IN 78 is further coupled to channel decoder 102 and to analog circuits 104. Converter state machine 96 is coupled to TEST BUS IN 78 and to the TEST DECODE BUS. Also, converter state machine 96 receives and provides various control signals, including control signals labeled STOP, RESET, CLK, WCCW, EOS, EOC, and RSAR to control bus 80. In response, converter state machine 96 provides control signals labeled STOP, IDLE, BUFFER, FINAL, CONVERT, and ZERO to analog circuits 104. In addition, converter state machine 96 receives control signals from CCW latch 94 and provides a latch enable signal to CCW latch 94.

Channel decoder 102 has a plurality of input terminals coupled to TEST DECODE BUS, a first plurality of output terminals coupled to the input enable terminals of analog multiplexer 106, a second plurality of output terminals coupled to the input enable terminal of analog multiplexer 108, and a plurality of port select signals connected to analog circuit 104 through a bus labeled "PORT SELECT BUS". Channel decoder 102 also receives signals from the CCW latch 94. Analog multiplexer 106 also includes a plurality of input/output terminals labeled "I/O" that are coupled to a plurality of input terminals of analog circuits 104 labeled $B_{IN}$. Analog multiplexer 106 also includes a plurality of terminals bi-directionally coupled to PORT A and analog multiplexer 108 includes a plurality of terminals bi-directionally coupled to PORT B. Analog circuits 104 has an input terminal for receiving the high reference voltage labeled "VRH" and an input terminal for receiving the low reference voltage labeled "VRL".

TEST BUS OUT 76 is coupled to receive signals from converter state machine 96, SAR 100, and analog circuits 104. SAR 100 receives a comparator out signal from analog circuits 104, test signals from TEST BUS IN 78, and a plurality of control signals from converter state machine 96. In response, SAR 100 also has a plurality of output terminals providing a SAR value [9:0] to input terminals of SAR buffer 98 and analog circuits 104. SAR buffer 98 has a plurality of input terminals for receiving the SAR value from SAR 100 and a plurality of output terminals for providing the SAR value to RAM data I/O 82. A loop back path 11 connects the CCW latch 94 to the SAR buffer 98 to allow the testing of the queue CCW logic.

The A/D converter 74 of FIG. 3 has several advantages. First, the plurality of ADC sub-modules can be tested separately and independently of each other using TEST BUS IN 78 and TEST BUS OUT 76. For example, analog multiplexer 106 and analog multiplexer 108 can be tested separately from converter state machine 96. This is possible because TEST BUS OUT 76 and TEST BUS IN 78 allow access to each of the plurality of ADC sub-modules of A/D converter 74. Second, because the plurality of ADC sub-modules may be tested separately, testing of A/D converter 74 can be organized as digital tests and analog tests. Generally, the digital tests require less time to perform than the analog tests and are accomplished first. Digital testing includes tests for the testing of program timer 72, clock prescaler 86, queue control 64, converter state machine 96, channel decoder 102, and analog multiplexers 106 and 108. Analog testing includes tests for testing the analog blocks of A/D converter 74, for example, analog circuits 104, SAR 100, and conversion tests of analog-to-digital converter 74. Thus, testing time may be reduced by using buses 76 and 78 to separately test digital and analog ADC sub-modules. Thirdly, the buses 76 and 78 enhance the control and visibility of the test being performed, as well as concurrent testing of modules outside of the QADC 46 since IMB 42 is not being used for this purpose.

In order to illustrate these testability features of QADC 46, an example test flow for testing queue control 64 of FIG. 3 will be described. The testing of the plurality of modules of data processing system 20 (FIG. 1) is performed by first placing the QADC 46 into a particular test mode. Each test of QADC 46 is identified using a test mode. When testing queue control 64, the queue control test mode is provided to IMB 42 from CPU 22 (FIG. 1). BIU 56 receives the test mode and provides the test mode to register 62. A tester, such as a Teradyne J971, controls the test flow. Once the type of test is identified, for example the testing of queue control 64, IMB 42 is placed in a slave mode. The tester then clears a right zero's to each result location of queue RAM 58. Once the RAM is cleared, CCW data is written to a queue portion of RAM 58 to build a queue. Based on the test mode bits stored in register 62, each sub-module of QADC 46 is reconfigured via TEST BUS OUT 76, TEST MODE BUS 84 and TEST BUS IN 78 in order to test queue control 64. At this point, interaction between QADC 46 and IMB 42 is complete allowing other modules of data processing system 20 to be tested concurrently with the testing of QADC 46. The testing of queue control 64 then continues by applying a test stimulus at a selected one of PORT A or PORT B. The test stimulus is essentially clock and trigger conditions applied to at least one of the ports (A or B). Again, it is understood that while the present embodiment has two ports (PORT A and PORT B), other embodiments need only have at least one of such plurality of ports for transmitting test information directly to a tester. As a result of the port stimulus, a trial response is provided to either PORT A or PORT B for use by the tester. Queue control 64 fetches a CCW from queue RAM 58 and conveys it to A/D converter 74 via RAM data I/O 82. The CCW is then passed through multiplexer 92 and CCW latch 94 to the LOOP BACK PATH and to SAR buffer 96, and then back to queue RAM 58. The tester then compares the trial response to an expected response and can either pass or fail queue control 64. Testing of each of the other sub-modules of QADC 46 can be completed in a similar manner except that testing of the other sub-modules may not first require the CCW to be cleared and then written back to queue RAM 58.

By allowing testing of each of the submodules in this manner, greater controllability and observability of the tests is provided. Also, test time is reduced through the use of accelerated clocking because the digital logic can function at higher speeds than the analog circuits. In addition, product development cycle time is reduced by improved localization and identification of defects. By only using IMB 42 for initial testing set up information, concurrent testing of other modules is possible. Further, production test time can be reduced by using a first fail mode strategy to allow a defective unit to be identified before time consuming and costly tests are performed. In addition, the performance of individual analog circuits of QADC 46 can be directly observed rather than only inferred, as in the prior art where the module can only be tested as a whole.

A/D converter 74 further provides a test mode for testing the flow of queue control 64 by using LOOP BACK PATH 11 between CCW latch 94 and SAR buffer 98. After placing the ADC in a queue control test mode, the queue is started by applying a trigger, such as a hardware trigger, from a pin to start one of the two queues of A/D converter 74. In response to address and read/write (R/W) control signals from queue control 64, CCW words are transferred from queue RAM 58 to A/D converter 74 without doing a conversion (a non-converted signal). A/D converter 74 transfers the CCW words as results to the result page, or portion, of queue RAM 58. This is done to allow testing of the flow without requiring the time and complexity of doing a conversion. This provides the significant advantage of allowing the many flow conditions to be tested, such as when testing the queue overrun flag or a queue completion or queue pause flag. Also, the visibility of these flags are available on a per cycle basis. These flags would be available during normal operation but, in order to check the flags, a read operation requiring multiple clock cycles must be performed. In addition, visibility of address pointers and status bits are available on a real-time basis. Thus, LOOP BACK PATH 11 provides significant advantages for testing modules on the A/D converter 74.

Figure 4:
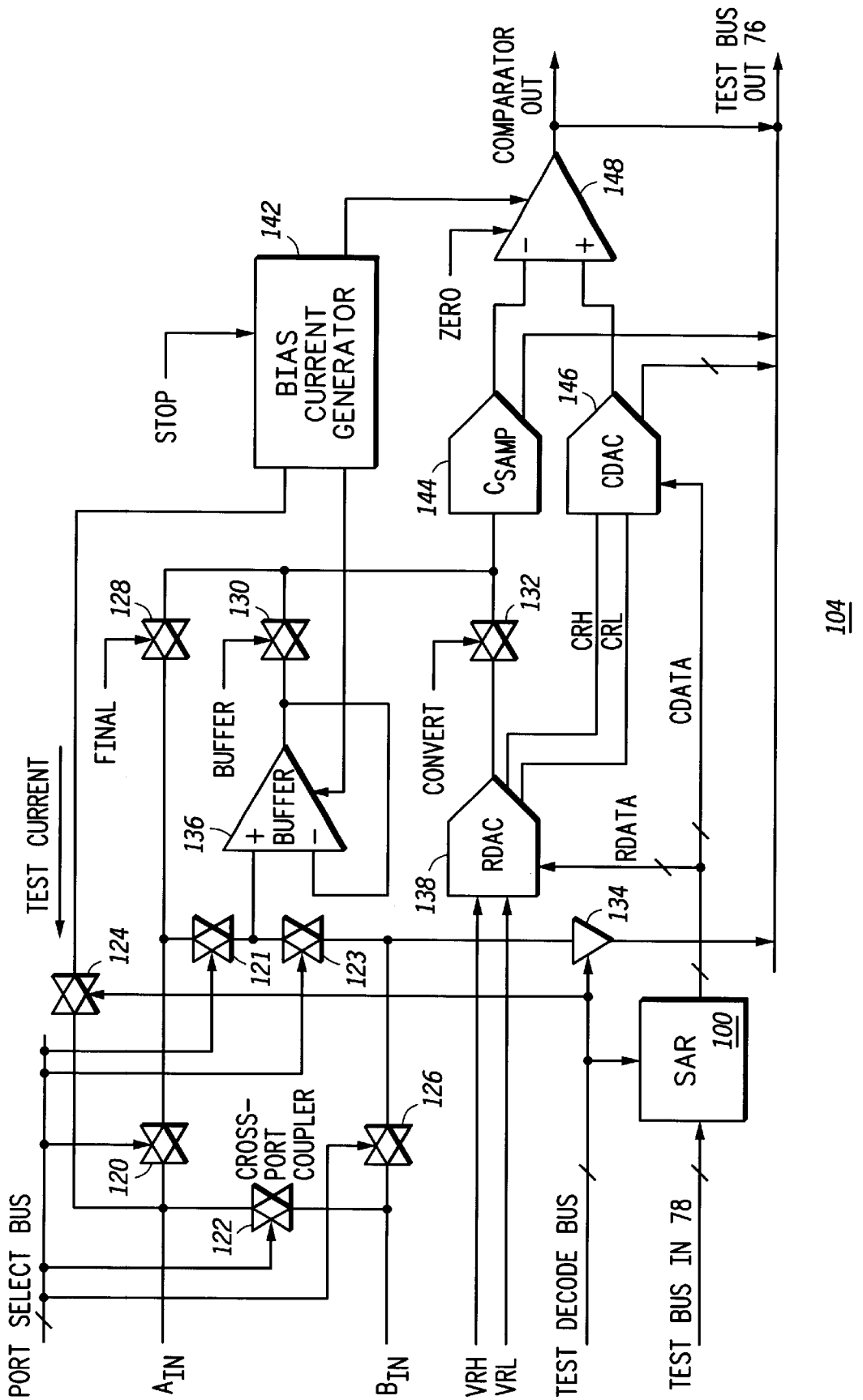
FIG. 4 illustrates, in partial block diagram form and partial logic diagram form, the analog circuits of FIG. 3.

FIG. 4 illustrates, in partial block diagram form and partial logic diagram form, analog circuits 104 of FIG. 3. Analog circuits 104 include analog switches 120, 121, 122, 123, 124, 126, 128, 130, and 132; and a plurality of modules including buffer 136, resistor digital-to-analog converter (RDAC) 138, bias current generator 142, capacitance sample circuit 144, capacitor digital-to-analog converter (CDAC) 146 and comparator 148. Analog switch 120 has an input terminal for receiving an input labeled $A_{IN}$, a control terminal for receiving a port select bus signal, and an output terminal. Analog switch 122, labeled CROSS-PORT COUPLER, has an input terminal for receiving $A_{IN}$, a control terminal for receiving the PORT SELECT BUS signal and an output terminal. Analog switch 124 has an input terminal for receiving signal TEST CURRENT, a control terminal connected to the test decode bus, and an output terminal coupled to the input terminal of analog switch 120. Analog switch 126 has an input terminal for receiving a signal labeled $B_{IN}$, a control terminal for receiving the PORT SELECT BUS signal, and an output terminal. Analog switch 128 has an input terminal connected to the output terminal of analog switch 120, a control terminal for receiving a control signal labeled FINAL, and an output terminal. Buffer circuit 136 has a first input terminal connected to the output terminal of analog switch 120, a second input terminal, a control terminal for receiving a bias signal from bias current generator 142 and an output terminal connected to an input terminal of analog switch 130. Analog switch 130 also includes a control terminal for receiving a control signal labeled BUFFER, and an output terminal connected to the output terminal of analog switch 128 as well as a connection to the input terminal of $C_{SAMP}$ 144. Buffer circuit 136 also has an output terminal connected to its second input terminal. RDAC 138 has a first input terminal for receiving a high reference voltage labeled $V_{RH}$, a second input terminal for receiving a low reference voltage labeled $V_{RL}$, a control terminal connected to a plurality of conductors labeled RDATA and an output terminal connected to an input terminal of analog switch 132. Analog switch 132 also includes a control terminal for receiving a control signal labeled CONVERT, and an output terminal connected to the output terminals of analog switches 128 and 130. RDAC 138 has a second output terminal for providing a signal labeled CRH to a first input terminal of CDAC 146, and a third output terminal for providing a signal labeled CRL to a second input terminal of CDAC 146. Buffer circuit 134 has a input terminal connected to the output terminal of analog switch 126, a plurality of control terminals coupled to the TEST DECODE BUS, and an output terminal connected to the TEST BUS OUT 76. $C_{SAMP}$ 144 has an input terminal connected to the output terminal of analog switch 132, a first output terminal connected to a first input terminal of comparator 148, and a second output terminal connected to test bus out 76. CDAC 146 has an output terminal connected to the input terminal of comparator 148 and a plurality of output terminals coupled to test bus out. The comparator 148 also has an input signal labeled zero, an output labeled comparator out and a second input from the bias current generator 142. The bias current generator 142 also has a control input labeled "STOP".

In normal operation, analog input signals are received by analog circuits 104 via either analog multiplexer 106 or analog multiplexer 108 (FIG. 3) that are to be converted. The CCW designates a predetermined set of condition parameters for the analog input samples for testing a set of conversion modes. The CCW's are received from queue RAM 58 via RAM data I/O 82 (FIG. 2). Conversions of each of the analog channels are controlled through channel decoder 102 (FIG. 3).

Analog-to-digital conversions performed by A/D converter 74 may be tested during a particular ADC test mode. The method of testing the ADC is as follows: The A/D converter 74 is first placed in an ADC test mode by the CPU 22 (FIG. 1). A start signal is then applied and the corresponding digital value is then read. It is important to note that the analog input signal applied and the digital value read are both tested directly through PORT A or PORT B, with all the advantages of avoiding use of the IMB 42 (FIG. 1) as described above. The actual analog-to-digital conversion occurs in analog circuits 104 illustrated in FIG. 4. The results of the conversions are provided to SAR 100. SAR 100 outputs a digital output that is a result of the analog to digital conversion. The result is read to verify that the digital output compares favorably to a predicted result. While FIG. 4 illustrates one implementation of the analog-to-digital converter, those skilled in the art to which the present invention pertains will recognize that other analog-to-digital converters can also be adapted for testing in accordance with the present invention.

The bias current circuit generator (i.e. bias circuit) is also tested using a method of the present invention. In FIG. 4, bias current generator 142 can be tested for start-up time and bias current versus voltage and temperature variations. In order to test bias current generator 142, a test mode is used to enter a bias current generator test. Start up time is measured at $A_{IN}$ (i.e. a port pin), and is measured from the time the control signal STOP is negated, to when the bias current TEST CURRENT is measured at another port pin, such as for example, PORT A via analog switch 124. The bias current TEST CURRENT is also measured while varying the power supply voltage, the voltage applied to the port pin, and temperature. The advantages of this test method is that using the port pin to directly transfer test information to and from a tester increases the controllability of the test, the visibility of the test and alleviates the use of the IMB 42.

Buffer amplifier 136 can be tested at the same time that the bias current generator 142 is tested using a buffer testing method. After placing the ADC in a buffer test mode, an input voltage is inputted by a tester at a first port pin (e.g. $B_{IN}$) via analog switches 126 and 123. The output voltage is then measured by the tester at a second port pin (e.g. $A_{IN}$) via analog switches 130, 128, and 120. Analog switch 121 is used to isolate the buffer input signal from the buffer output signal in this mode. The inputting and measuring steps are then performed over a range of input and output voltages to provide test information to a tester about the buffer amplifier 136 directly through the first and second port pins.

A method of testing comparator 148 is also provided herein. After placing the ADC in a comparator test mode, an input voltage is applied at a PORT B terminal such as, for example, the port pin labeled $B_{IN}$. Using the buffer control signal, a reference voltage is selected to be either the output of buffer amplifier 136 (buffer output signal) or as input directly through PORT A pin labeled $A_{IN}$ (second port pin). Comparator 148 is then zeroed using control signal labeled ZERO. Then the input voltage and CDAC 146 output voltage are varied by applying input signals to CDAC 146 via bus labeled CDATA. The output of comparator 148 labeled COMPARATOR OUT is then monitored to determine the input step size required to make transitions at the comparator output. The comparator circuit test mode allows direct visibility and controllability, through the port pins, of the gain characteristics of the embedded comparator circuit 148 and the CDAC step size.

By allowing testing of the individual blocks of analog circuits 104, characteristics of the analog circuit block can be measured which are not normally visible. Tests on buffer amplifier 136 allows measurements of the offset voltage and drive strength of the buffer amplifier. Also individual testing of comparator 148 in the above described manner allows measurement of gain characteristics of the comparator as well as measuring CDAC 146 step size.

In addition to the above tests, RDAC 138 is tested by using a method of testing of the present invention. After placing the QADC 46 in RDAC test mode, predetermined digital values are inputted via TEST BUS IN 78 into the input terminals of SAR 100. A clock pulse is then applied to load SAR register bits and the SAR register bits are read out as a digital value and simultaneously applied to RDAC 138. The RDAC output analog voltage is read out through analog switches 132, 128, and 120 at PORT A terminal labeled $A_{IN}$. This provides the benefit of improved fault grade of logic associated with the analog circuitry as well as allowing direct measurement of RDAC linearity.

Referring back to FIG. 3, analog multiplexers 106 and 108 can be tested using a method of testing of the present invention. After placing the QADC 46 in a multiplexer test mode, analog switch 122, labeled CROSS-PORT COUPLER in FIG. 4, is used to couple PORT A pin $A_{IN}$ to PORT B pin $B_{IN}$. Testing of the analog multiplexers 106 and 108 is performed by inputting a sequential patterning of 1's and 0's (sequential high values and sequential low values) at each analog input and watching that the output on the selected output channel matches the input sequence only for the selected input channel. The use of the CROSS-PORT COUPLER in this way allows testing of the analog multiplexers 106 and 108 without requiring a conversion. Also, the analog multiplexer impedance can be measured, which is an important analog multiplexer parameter.

Figure 5:
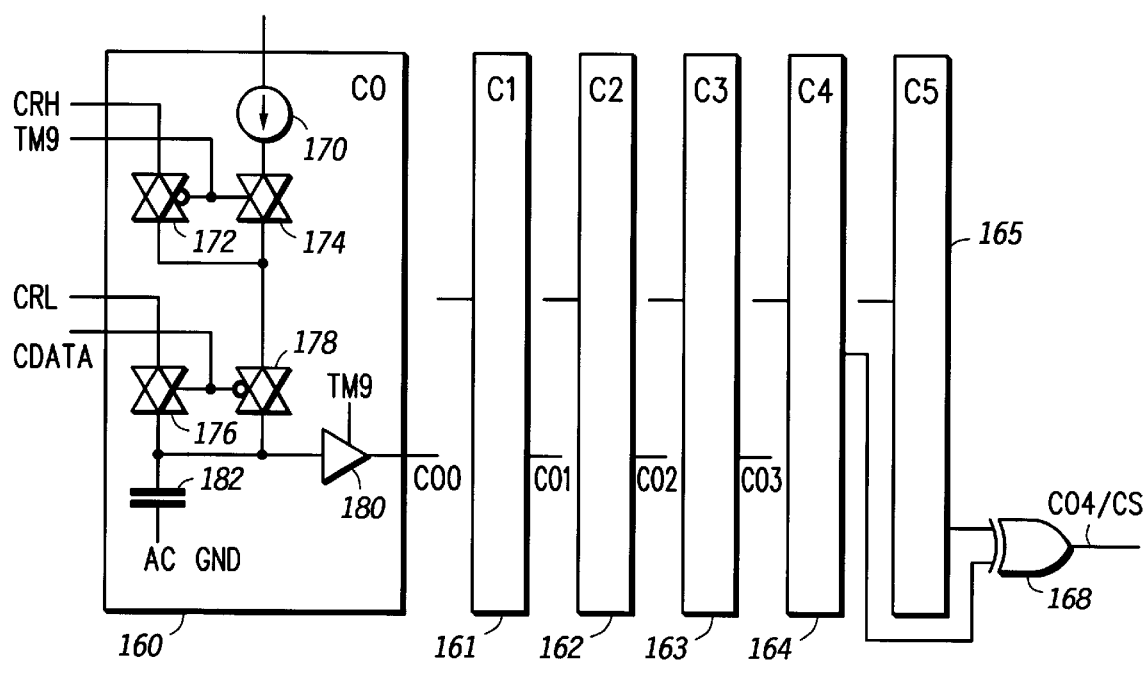
FIG. 5 illustrates, in partial block diagram form and partial logic diagram form, the CDAC of FIG. 4.

FIG. 5 illustrates, in partial block diagram form and partial logic diagram form, the CDAC 146 of FIG. 4. CDAC 146 includes capacitor circuits 160–165 and exclusive OR logic gate 168. Each of the capacitor circuits includes circuitry as shown in capacitor circuit 160. Capacitor circuit 160 includes current source 170, analog switches 172, 174, 176 and 178, buffer 180 and capacitor 182. Current source 170 has an input terminal coupled to a supply voltage terminal and an output terminal. Analog switch 172 has an input terminal for receiving signal CRH, a control terminal for receiving a test mode signal (TM9) and an output terminal. Analog switch 174 has an input terminal coupled to the output terminal of current source 170, a control terminal for receiving the test mode signal and an output terminal coupled to output terminal of analog switch 172. Analog switch 176 has an input terminal for receiving signal CRL and for receiving signal CDATA and an output terminal. Analog switch 178 has an input terminal coupled to the output terminal of analog switches 172 and 174, a control terminal for receiving CDATA, and an output terminal coupled to the output terminal of analog switch 176. Capacitor 182 has a first plate electrode coupled to the output terminals of analog switches 176 and 178 and a second plate electrode coupled to an AC ground. Buffer circuit 180 has an input terminal coupled to the output terminals of analog switches 176, 178 and a control terminal for receiving test mode signal and an output terminal for providing an output signal labeled C00.

The method of testing CDAC 146 is as follows: After placing the QADC in a capacitor test mode, logic high inputs are applied to the successive approximation register and clocked onto CDATA to discharge each of the plurality of capacitors to potential CRL such as capacitor 182. The output bits, in the SAR register, are read to ensure that they are the correct logic level, for example, a logic high value. Then logic low inputs are provided on CDATA to initiate capacitor charging. Each of the plurality of capacitors are then charged to provide a capacitor time out value for determining the capacitor charging time. Because the current sources, such as current source 170, and the buffer threshold values, such as buffer 180, are matched, the charging time will be proportional to the capacitor value. In addition to measuring the size of the capacitor, it can also be determined whether there is a short or an open. In addition, the SAR register bits associated with the CDAC can be tested. Providing testing of the CDAC in this way allows early screening of CDAC defects and allows the locality of the failure to be determined without extensive and time consuming linearity testing.

Figure 6:
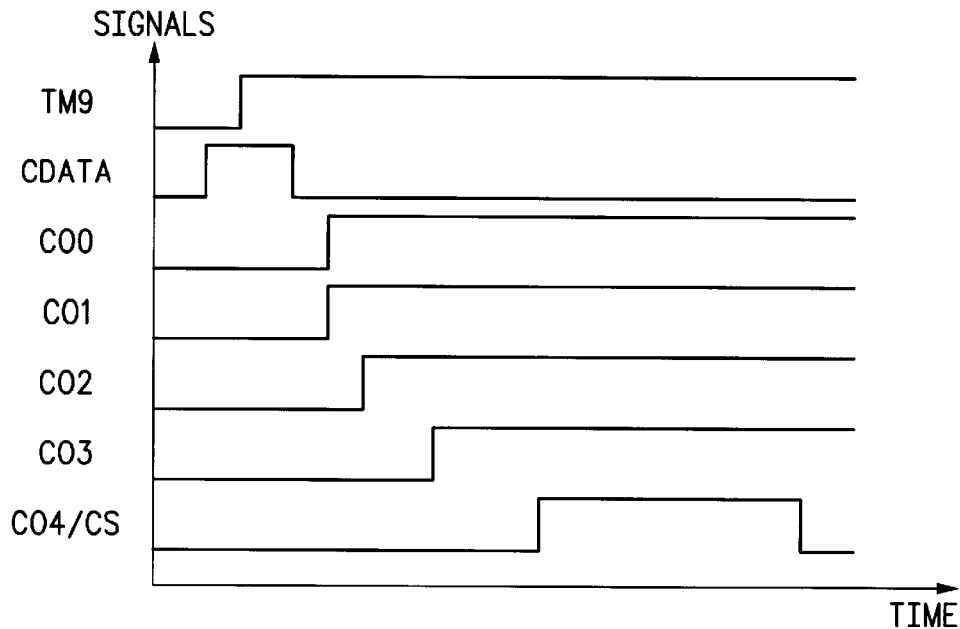
FIG. 6 illustrates a timing diagram of the signals associated with testing of the CDAC of FIG. 4.

FIG. 6 illustrates a timing diagram of the signals associated with testing of CDAC 146. From this timing diagram, it can be determined if a capacitor is broken or missing by observing the wave form at the outputs of each of the capacitor circuits. For example, a missing falling edge on output C04/CS would indicate that the capacitor and analog switches in capacitor circuit 165 are either defective or shorted to CRL. Furthermore, if a rising or falling edge occurs earlier than expected, the capacitor, or one or more of its constituent elements, may not be connected, due to a processing defect. Likewise, if a rising or falling edge occurs later than expected, the capacitor may be shorted to other capacitive elements.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

We claim:

1. A data processing system, comprising:

a central processing unit;

a plurality of circuit modules; and an intermodule bus for coupling the plurality of circuit modules to the central processing unit;

wherein a module of the plurality of circuit modules includes a plurality of sub-modules that can be individually tested, wherein during testing of the module, test setup information for testing a sub-module of the plurality of sub-modules is provided via the intermodule bus, and wherein the module includes a test bus, the test bus being different than the intermodule bus and is coupled to each of the sub-modules and to the at least one port terminal, the at least one port terminal for receiving test results from a sub-module from the test bus and for transmitting test results of the sub-module during testing of the sub-module.

2. The data processing system of claim 1, wherein the module is an analog-to-digital converter.

3. The data processing system of claim 2, wherein the test bus includes a first test bus coupled to each of the plurality of sub-modules for transmitting at least the test setup information to the sub-module, and a second test bus for transmitting test results of a sub-module under test to the at least one port terminal.

4. The data processing system of claim 2, wherein at least one of the plurality of sub-modules is characterized as having digital circuits and at least one of the plurality of sub-modules as characterized as having analog circuits.

5. The data processing system of claim 2, wherein the at least one port terminal is one terminal of a plurality of bi-directional port terminals, the data processing system further comprising a pad control circuit coupled to the plurality of bi-directional port terminals, to the test bus, and to a data bus, the pad control circuit for coupling the plurality of bi-directional port terminals to the test bus during testing of the module, and for coupled the plurality of bi-directional port terminals to the data bus during normal operation of the data processing system.

6. The data processing system of claim 1, wherein the at least one port terminal is for transferring the test results to a tester that is external to the data processing system.

7. The data processing system of claim 1, wherein the data processing system is characterized as being a microcontroller.

8. In a data processing system having a central processing unit, a plurality of modules, and an intermodule bus for coupling the plurality of modules to the central processing unit, a module of the plurality of modules having an input/output port, and the module having a plurality of sub-modules, a method of testing a sub-module of the plurality of sub-modules, comprising the steps of:

coupling each of the sub-modules and the input/output port to a test bus, the test bus being different than the intermodule bus;

providing test setup information to the sub-module via the intermodule bus;

testing the sub-module; and providing test results of the sub-module to a tester that is external to the data processing system via the test bus to the input/output port.

9. The method of claim 8, wherein the module is an analog-to-digital converter and the sub-module is a buffer circuit in the analog-to-digital converter, the method further comprising the steps of:

inputting an input voltage at a first port terminal of the input/output port;

measuring an output voltage at a second port terminal of the input/output; and repeating said inputting step and said measuring step for a range of said input voltage and said output voltage, wherein said inputting step and said measuring step provide a test information of said buffer directly through the input/output port.

10. In a data processing system having a central processing unit, a plurality of modules, and an intermodule bus for coupling the plurality of modules to the central processing unit, a module of the plurality of modules being an analog-to-digital converter (ADC), the ADC having a plurality of sub-modules and an input/output port, a method of testing the ADC comprising the steps of:

coupling the plurality of sub-modules to the input/output port using a test bus, the test bus being different than the intermodule bus;

applying ADC test mode signals to the ADC via the intermodule bus to place the ADC into a test mode;

applying an analog input signal to the ADC via the input/output port;

applying a start signal to cause the ADC to begin a conversion process;

reading a digital value from the ADC after the conversion process to determine that the digital value compares favorably to a predicted result; and providing the predicted result to the input/output port via the test bus.

* * * * *